(12) United States Patent
Katsube et al.

(10) Patent No.: US 12,249,922 B2
(45) Date of Patent: Mar. 11, 2025

(54) POWER CONVERSION DEVICE

(71) Applicant: Mitsubishi Electric Corporation, Tokyo (JP)

(72) Inventors: Hiroki Katsube, Tokyo (JP); Shota Yamabe, Tokyo (JP); Masakazu Tani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 189 days.

(21) Appl. No.: 17/898,611

(22) Filed: Aug. 30, 2022

(65) Prior Publication Data
US 2023/0291322 A1 Sep. 14, 2023

(30) Foreign Application Priority Data
Mar. 10, 2022 (JP) .................. 2022-036934

(51) Int. Cl.
*H05K 7/20* (2006.01)
*H02H 7/00* (2006.01)
(Continued)

(52) U.S. Cl.
CPC .......... *H02M 7/003* (2013.01); *H05K 5/0217* (2013.01); *H05K 7/209* (2013.01); *H05K 7/20927* (2013.01)

(58) Field of Classification Search
CPC ..... H02M 7/003; H05K 5/0217; H05K 7/209; H05K 7/20927
(Continued)

(56) References Cited

U.S. PATENT DOCUMENTS 6,326,761 B1 * 12/2001 Tareilus ............... H02M 7/003
   318/722
6,542,365 B2 * 4/2003 Inoue .................. H01L 23/473
   361/689
(Continued)

FOREIGN PATENT DOCUMENTS

JP   2012-217322 A   11/2012
JP   2013-31330 A    2/2013
(Continued)

OTHER PUBLICATIONS

Office Action issued Mar. 14, 2023 in Japanese Application No. 2022-036934.
(Continued)

*Primary Examiner* — Anatoly Vortman
(74) *Attorney, Agent, or Firm* — Sughrue Mion, PLLC

(57) ABSTRACT

An object is to provide a power conversion device that enables a capacitor element to be efficiently cooled, thus suppressing deterioration of the capacitor element due to heat. The power conversion device includes: a power module including a module body portion storing a semiconductor element, and a power terminal protruding from the module body portion; a capacitor module including a capacitor body portion storing a capacitor element, and a capacitor busbar protruding from the capacitor body portion and connected to the power terminal; and a housing storing the power module and the capacitor module. The housing has a first surface to which the power module is thermally connected, and a second surface to which the capacitor module is thermally connected. A coolant path for cooling the first surface is provided on a back side of the first surface. The capacitor busbar is thermally connected to the first surface.

21 Claims, 9 Drawing Sheets

(51) Int. Cl.
*H02M 7/00* (2006.01)
*H05K 5/02* (2006.01)

(58) Field of Classification Search
USPC .......................................................... 361/699
See application file for complete search history.

(56) References Cited

U.S. PATENT DOCUMENTS

| | | | | |
|---|---|---|---|---|
| 7,200,007 | B2 * | 4/2007 | Yasui | H02M 7/003 |
| | | | | 338/53 |
| 7,307,841 | B2 * | 12/2007 | Berlin | H05K 7/20909 |
| | | | | 257/E23.098 |
| 7,508,668 | B2 * | 3/2009 | Harada | H01L 23/473 |
| | | | | 361/689 |
| 7,633,758 | B2 * | 12/2009 | Oohama | H01L 25/117 |
| | | | | 257/713 |
| 7,965,510 | B2 * | 6/2011 | Suzuki | B60K 6/405 |
| | | | | 361/689 |
| 7,978,471 | B2 * | 7/2011 | Tokuyama | H05K 7/20927 |
| | | | | 165/80.4 |
| 8,659,130 | B2 * | 2/2014 | Takagi | H01L 24/34 |
| | | | | 257/713 |
| 10,490,469 | B2 * | 11/2019 | Tani | H02M 1/44 |
| 10,888,035 | B2 * | 1/2021 | Yamabe | H05K 7/209 |
| 2003/0067749 | A1 * | 4/2003 | Tamba | H05K 7/20927 |
| | | | | 165/80.4 |
| 2014/0160823 | A1 | 6/2014 | Uetake et al. | |
| 2018/0174934 | A1 * | 6/2018 | Tani | H02M 7/003 |
| 2019/0198246 | A1 | 6/2019 | Kanda et al. | |
| 2019/0208672 | A1 * | 7/2019 | Yamabe | H02M 7/48 |
| 2021/0273575 | A1 * | 9/2021 | Kitahama | H02M 7/003 |
| 2022/0020661 | A1 * | 1/2022 | Tani | H02M 3/003 |

FOREIGN PATENT DOCUMENTS

| | | |
|---|---|---|
| JP | 2015-126674 A | 7/2015 |
| JP | 2017-139886 A | 8/2017 |
| JP | 2017-188998 A | 10/2017 |
| JP | 2019-117886 A | 7/2019 |
| JP | 2019-179807 A | 10/2019 |
| JP | 2021-22997 A | 2/2021 |
| JP | 2022-19040 A | 1/2022 |

OTHER PUBLICATIONS

Japanese Office Action issued Apr. 16, 2024 in Application No. 2023-125281.

* cited by examiner

POWER CONVERSION DEVICE

BACKGROUND

The present disclosure relates to a power conversion device.

In an electric vehicle using a motor as a drive source as in an electric automobile or a hybrid vehicle, a plurality of power conversion devices are mounted. Examples of power conversion devices include a charger for converting commercial AC power to DC power and charging a high-voltage battery, a DC/DC converter for converting DC power of a high-voltage battery to voltage (e.g., 12 V) for an auxiliary-device battery, and an inverter for converting DC power from a battery to AC power for a motor.

As an example of such power conversion devices, disclosed is a power conversion device including a power module having a semiconductor element for performing power conversion, a cooler for cooling the power module, and a capacitor having a capacitor element for smoothing DC voltage supplied from an external DC power supply (see, for example, Patent Document 1). Since ripple current flows through the capacitor element, the capacitor element consumes power and generates heat. In addition, the capacitor element is connected to the power module via a busbar, and therefore, when the temperature of the power module increases, heat transfers from the power module to the capacitor element via the busbar, and the temperature of the capacitor element is also increased by the transferred heat. In particular, in a high-output-density power conversion device, heat transfer to the busbar connecting the power module and the capacitor element, and heat generation due to Joule heat of the busbar, are increased. When the temperature of the busbar is significantly increased, heat transfers to the capacitor element and the temperature of the capacitor element increases. Temperature increase in the capacitor element shortens the life of the capacitor element, thus posing a problem of taking measures for temperature increase in the capacitor element.

In a structure disclosed in Patent Document 1, a power conversion device includes: a capacitor having a capacitor element, an open-side electrode and a bottom-wall-side electrode which are a pair of electrodes formed at both end surfaces of the capacitor element, capacitor busbars respectively connected to these electrodes, and a capacitor case storing the capacitor element therein; a power module connected to the capacitor busbars; and a cooler. The open-side electrode is connected to a cooler-side terminal of the power module. The bottom-wall-side electrode is thermally connected via a sealing material to a bottom wall of the capacitor case located on the bottom-wall side of the capacitor element.

Patent Document 1: Japanese Laid-Open Patent Publication No. 2017-139886

In Patent Document 1, heat generated in the capacitor element can be dissipated from the bottom-wall-side electrode side to the capacitor case via the sealing material. However, heat dissipation from the open-side electrode side is made through a terminal of the power module and the capacitor busbar whose thermal resistance increases because the heat dissipation path is long. Thus, there is a problem that the capacitor element cannot be sufficiently cooled from the open-side electrode side. In addition, as the heat generation amount of the power module increases due to the high output density of the power conversion device, heat that the capacitor element receives from the power module increases, thus causing a problem that the capacitor element is deteriorated due to the heat reception.

SUMMARY

Accordingly, an object of the present disclosure is to provide a power conversion device that enables a capacitor element to be efficiently cooled, thus suppressing deterioration of the capacitor element due to heat.

A power conversion device according to the present disclosure includes: a power module including a module body portion storing a semiconductor element, and a power terminal protruding from the module body portion; a capacitor module including a capacitor body portion storing a capacitor element, and a capacitor busbar protruding from the capacitor body portion and connected to the power terminal; and a housing storing the power module and the capacitor module. The housing has a first surface to which the power module is thermally connected, and a second surface to which the capacitor module is thermally connected. A coolant path for cooling the first surface is provided on a back side of the first surface. The capacitor busbar is thermally connected to the first surface.

The power conversion device according to the present disclosure includes: the power module including the module body portion storing the semiconductor element, and the power terminal protruding from the module body portion; the capacitor module including the capacitor body portion storing the capacitor element, and the capacitor busbar protruding from the capacitor body portion and connected to the power terminal; and the housing storing the power module and the capacitor module. The housing has the first surface to which the power module is thermally connected, and the second surface to which the capacitor module is thermally connected. The coolant path for cooling the first surface is provided on the back side of the first surface. The capacitor busbar is thermally connected to the first surface. Thus, heat generated in the capacitor element is dissipated from the second surface of the housing, and also dissipated from the first surface of the housing via a part of the capacitor busbar that is thermally connected to the first surface. Therefore, the capacitor element can be efficiently cooled from both of the first surface and the second surface, whereby deterioration of the capacitor element due to heat can be suppressed. In addition, generated heat of the capacitor busbar itself and heat of the power module which transfers from the power terminal to the capacitor busbar can be dissipated from the first surface of the housing, whereby deterioration of the capacitor element due to heat can be suppressed.

DETAILED DESCRIPTION OF THE EMBODIMENTS

Figure 1:
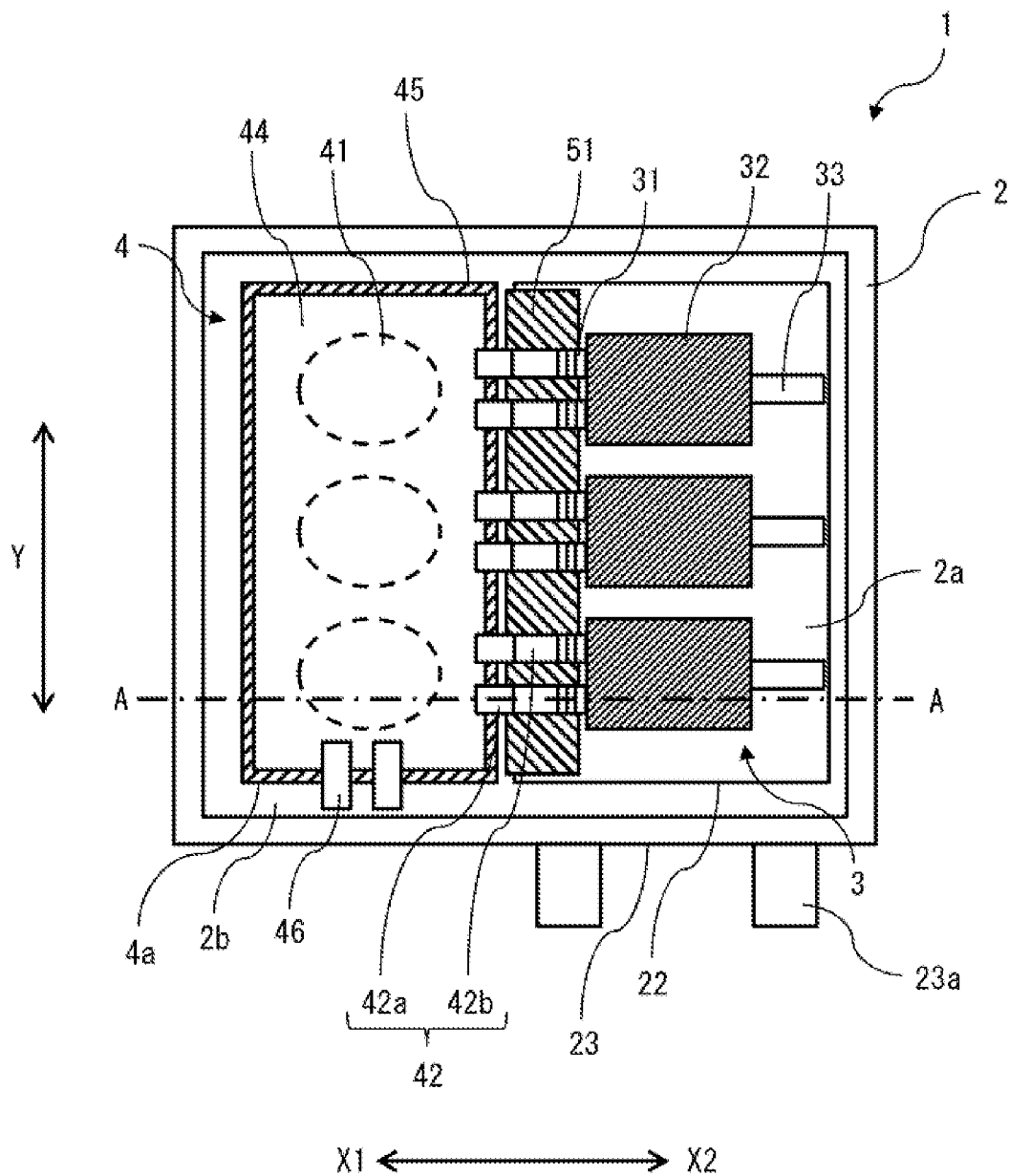
FIG. 1 is a plan view schematically showing a power conversion device according to the first embodiment of the present disclosure.

Hereinafter, a power conversion device according to embodiments of the present disclosure will be described with reference to the drawings. In the drawings, the same or corresponding members and parts are denoted by the same reference characters, to give description.

First Embodiment

Figure 2:
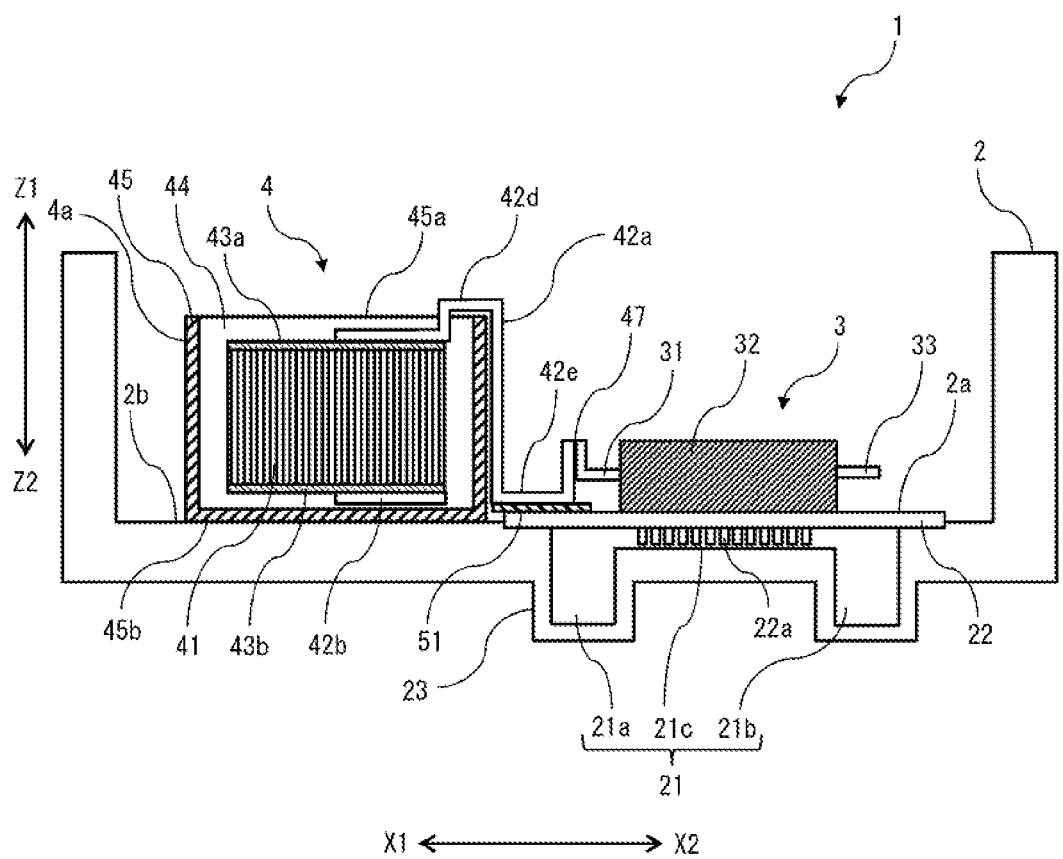
FIG. 2 is a sectional view of the power conversion device taken at an A-A cross-section position in FIG. 1.
Figure 3:
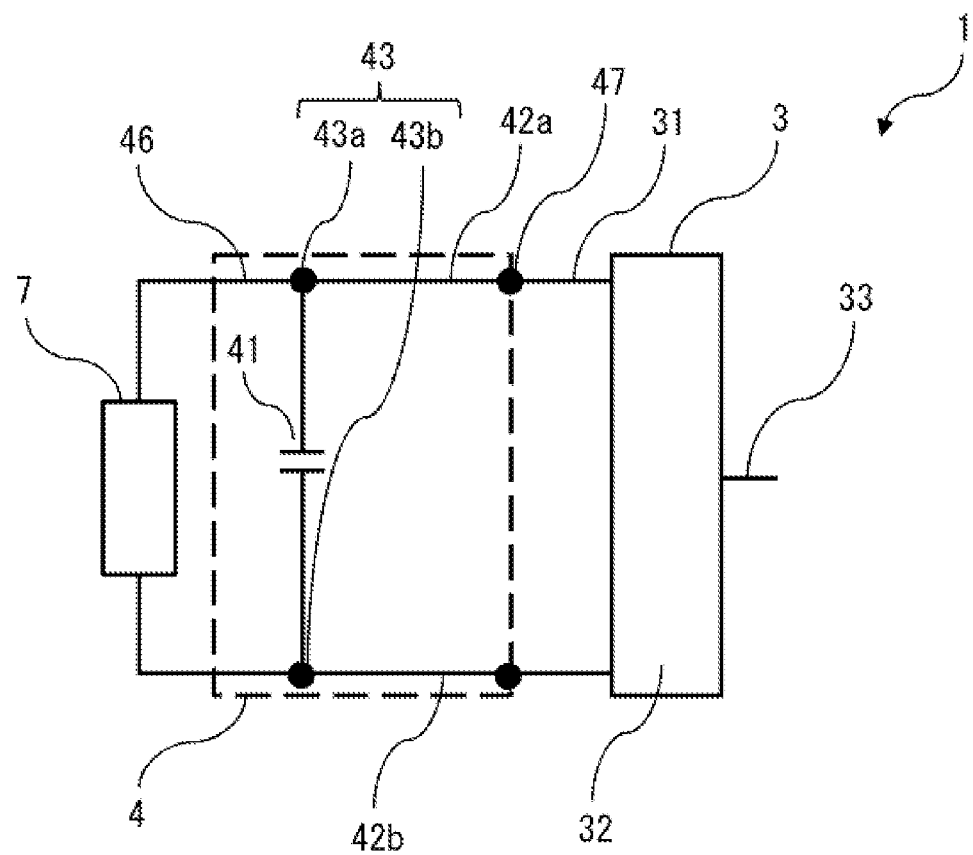
FIG. 3 schematically shows a circuit of the power conversion device according to the first embodiment.

FIG. 1 is a plan view schematically showing a power conversion device 1 according to the first embodiment, with internal wiring of a capacitor module 4 not shown. FIG. 2 is a sectional view of the power conversion device 1 taken at an A-A cross-section position in FIG. 1. FIG. 3 schematically shows a circuit of the power conversion device 1. The power conversion device 1 is a device for converting input current from DC to AC or from AC to DC, or converting input voltage to different voltage.

As shown in FIG. 1, the power conversion device 1 includes power modules 3, the capacitor module 4, and a housing 2. The housing 2 stores the power modules 3 and the capacitor module 4. The power conversion device 1 in the present embodiment is a device in which, as shown in FIG. 3, DC power inputted from power-supply-side terminals 46 of the capacitor module 4 connected to a DC power supply 7, and then smoothed by the capacitor module 4, is converted by the power module 3, and the resultant power is outputted from an output terminal 33. In the present embodiment, the power conversion device 1 outputs three-phase AC power, and as shown in FIG. 1, three power modules 3 corresponding to the respective phases are provided. In FIG. 3, only one power module 3 is shown, but the other two power modules also have the same configurations. The DC power supply 7 provided outside the power conversion device 1 and connected to the power-supply-side terminals 46 is not shown in FIG. 1. The power conversion device 1 is not limited to the above configuration, and may be a device that converts input current from AC to DC.

<Housing 2>

The housing 2 is made from metal such as aluminum. As shown in FIG. 2, the housing 2 is formed in a bottomed tubular shape, for example. The housing 2 has a first surface 2*a* to which the power modules 3 are thermally connected, and a second surface 2*b* to which the capacitor module 4 is thermally connected. A coolant path 21 for cooling the first surface 2*a* is provided on the back side of the first surface 2*a*. A part of the housing 2 where the coolant path 21 is provided is a path forming portion 23. The coolant path 21 is a path in which a coolant flows. As the coolant, for example, water or an ethylene glycol solution is used. Here, a direction opposite to the normal direction of the first surface 2*a* is defined as a normal opposite direction, a specific direction parallel to the first surface 2*a* is defined as a first direction, and a direction parallel to the first surface 2*a* and perpendicular to the first direction is defined as a second direction. In the drawings, an X1 direction is defined as one side in the first direction, an X2 direction is defined as another side in the first direction, a Y direction is defined as the second direction, a Z1 direction is defined as the normal direction, and a Z2 direction is defined as the normal opposite direction.

A part of the housing 2 that has the first surface 2*a* is a base portion 22 formed in a plate shape. The base portion 22 is made of, for example, metal such as aluminum, as with a body part of the housing 2. However, without limitation thereto, the base portion 22 may be made of a resin member having high thermal conductivity. A back surface of the base portion 22 on the back side of the first surface 2*a* forms a part of the inner surface of the coolant path 21. One or a plurality of cooling fins 22*a* are provided on the back surface of the base portion 22 in an area overlapping module body portions 32, as seen in the normal direction. The coolant path 21 includes an upstream-side path 21*a*, a downstream-side path 21*b*, and an intermediate path 21*c*. The intermediate path 21*c* is a path in which the coolant flows through the cooling fins 22*a* from the one side in the first direction to the other side in the first direction. The upstream-side path 21*a* is a path connected to the one side in the first direction of the intermediate path 21*c* and extending in the second direction. The downstream-side path 21*b* is a path connected to the other side in the first direction of the intermediate path 21*c* and extending in the second direction.

The coolant flows through the upstream-side path 21*a*, the intermediate path 21*c*, and the downstream-side path 21*b* in this order. As shown in FIG. 1, the path forming portion 23 has headers 23*a*. The headers 23*a* are flow-in/out ports through which the coolant flows into the coolant path 21 or the coolant flows out from the coolant path 21. The headers 23*a* are provided so as to protrude from an outer wall surface of the housing 2. The upstream-side path 21*a* is located so as to overlap an area between the module body portions 32 and a capacitor body portion 4*a*, as seen in the normal direction. With this structure, the coolant having a low temperature before cooling the power modules 3 flows in the upstream-side path 21*a*, and therefore the second surface 2*b* located adjacently to the first surface 2*a* is also efficiently cooled by the upstream-side path 21*a*. Since the second surface 2*b* is cooled, the capacitor module 4 thermally connected to the second surface 2*b* can be cooled.

Figure 4:
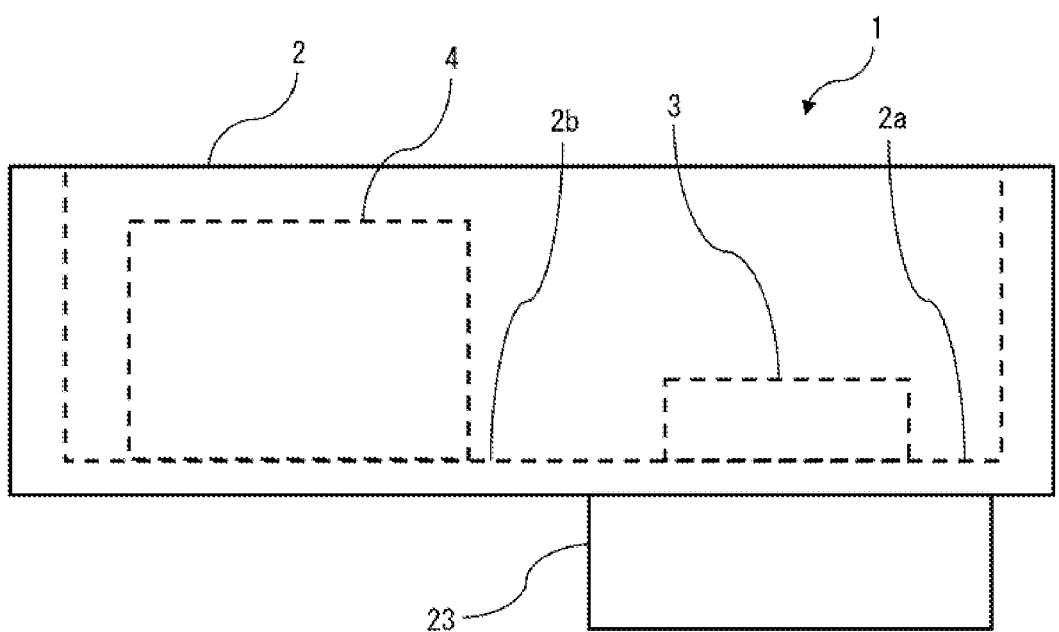
FIG. 4 is a side view schematically showing another power conversion device according to the first embodiment.

The structure of the path forming portion 23 is not limited to the structure shown in FIG. 2, and may be a structure shown in FIG. 4. FIG. 4 is a side view schematically showing another power conversion device 1 according to the first embodiment. The housing 2 shown in FIG. 4 does not have the base portion 22, and the housing 2 has the first surface 2*a* and the second surface 2*b* at the inner surface of the bottom wall of the housing 2. The housing 2 has the path forming portion 23 at the outer surface of the bottom wall of the housing 2 on the back side of the first surface 2*a*. In FIG. 4, the headers 23*a* are not shown. Also with this structure, the first surface 2*a* can be cooled by the coolant path provided in the path forming portion 23.

<Power Module 3>

The power module 3 includes the module body portion 32 storing one or a plurality of semiconductor elements (not shown), power terminals 31, the output terminal 33, and a plurality of control terminals (not shown). The power terminals 31, the output terminal 33, and the control terminals are provided so as to protrude outward from the module body portion 32. The module body portion 32 part shown in FIG. 1 is a case or a protection member such as resin surrounding the semiconductor elements, for example. The power terminals 31, the output terminal 33, and the control terminals are made of copper which is small in electric resistivity and excellent in electric conductivity, for example. The power terminals 31 are electrically connected to capacitor busbars 42 of the capacitor module 4. In a manufacturing process for the power module 3, the power terminals 31, the output terminal 33, and the plurality of control terminals are supported by the same lead frame. After the module body portion 32 is sealed with resin in a state in which the terminals are supported by the lead frame, the terminals are separated from the lead frame. This process is a general manufacturing process for manufacturing the power module 3.

<Capacitor Module 4>

The capacitor module 4 includes the capacitor body portion 4a storing the capacitor elements 41, and the capacitor busbars 42 protruding from the capacitor body portion 4a and connected to the power terminals 31. Each capacitor element 41 has capacitor electrodes 43 at both ends. Each capacitor electrode 43 is a positive electrode or a negative electrode. Each capacitor busbar 42 has one end electrically connected to the capacitor element 41 and another end electrically connected to the power terminal 31. The capacitor busbar 42 is made of copper which is small in electric resistivity and excellent in electric conductivity, for example. The capacitor busbar 42 and the power terminal 31 are connected by welding at a power terminal connection portion 47 via which both members contact with each other. A connection method for the capacitor busbar 42 and the power terminal 31 is not limited to welding, and they may be connected by soldering, fitting, or screwing.

In the present embodiment, the capacitor body portion 4a has a capacitor case 45 formed in a bottomed tubular shape and storing, with sealing resin 44 interposed, the capacitor elements 41 and parts of the capacitor busbars 42 that are connected to the capacitor elements 41. The capacitor case 45 is manufactured by die casting from aluminum, for example. The sealing resin 44 is a member made of epoxy resin or the like and having insulating property. The material and the shape of the capacitor case 45 are not limited thereto. The capacitor case 45 may be made of resin and may directly store the capacitor elements 41. A bottom wall 45b of the capacitor case 45 is formed in a rectangular shape, for example. The capacitor case 45 has an opening 45a which is an opening part of the capacitor case 45 on the side opposite to the bottom wall 45b. Each capacitor busbar 42 protrudes through the opening 45a from the sealing resin 44. A part of the capacitor busbar 42 that protrudes and is exposed from the sealing resin 44 is an exposed portion 42d. In the present embodiment, the capacitor case 45 is placed with the opening 45a facing in the normal direction, and the capacitor busbar 42 protrudes in the normal direction from the sealing resin 44. Arrangement of the capacitor case 45 is not limited thereto, and the capacitor case 45 may be placed with the opening 45a facing toward the other side in the first direction so that the capacitor busbar 42 protrudes toward the power module 3 side from the sealing resin 44.

The outer surface of the bottom wall 45b of the capacitor case 45 and the second surface 2b of the housing 2 are thermally connected to each other. The way of thermal connection is not limited to a case where the bottom wall 45b and the second surface 2b are connected by directly contacting with each other. The bottom wall 45b and the second surface 2b may be thermally connected to each other via a heat transfer member such as grease. By thermally connecting the capacitor case 45 to the housing 2, heat of the capacitor element 41 can be dissipated from the bottom wall 45b side of the capacitor case 45, whereby heat dissipation performance for the capacitor element 41 can be improved.

The capacitor element 41 smooths DC power. The capacitor element 41 is a film capacitor of a wound type having a stacked structure. The capacitor element 41 has metal films stacked while a dielectric material which is a member having insulating property is interposed. The capacitor element 41 has the capacitor electrodes 43 at end surfaces in the normal direction and the normal opposite direction that cross the first direction corresponding to the stacking direction of the metal films. In the present embodiment, one capacitor electrode 43 is located on the bottom wall 45b side and the other capacitor electrode 43 is located on the opening 45a side. Arrangement of the capacitor electrodes 43 is not limited thereto. The capacitor electrodes 43 may be provided at a side part of the capacitor element 41 located between the bottom wall 45b side and the opening 45a side of the capacitor element 41. The thermal conductivity of the metal films is higher than the thermal conductivity of the dielectric material. Therefore, the thermal conductivity of the capacitor element 41 is higher in a direction perpendicular to the stacking direction of the metal films than in the first direction corresponding to the stacking direction of the metal films. When the capacitor electrode 43 and the bottom wall 45b are located in the normal opposite direction as in the present embodiment, the thermal conductivity of the capacitor element 41 is higher in the normal opposite direction. Therefore, if the direction in which the thermal conductivity of the capacitor element 41 is higher is aligned with the direction of the heat dissipation path where the bottom wall 45b of the capacitor case 45 is located, it is possible to dissipate heat of the capacitor element 41 to the bottom wall 45b side of the capacitor case 45 more efficiently.

In the present embodiment, the capacitor case 45 stores three capacitor elements 41. In FIG. 1, the outer shape of each capacitor element 41 is indicated by a broken line. The three capacitor elements 41 are respectively connected to the three power modules 3. The number of the capacitor elements 41 is not limited to three. A plurality of power modules 3 may be connected to one capacitor element 41, or a plurality of capacitor elements 41 and one power module 3 may be connected to each other.

In the present embodiment, a plurality of the module body portions 32 are provided so as to be arranged in the second direction. The capacitor module 4 is located on the one side in the first direction of the plurality of module body portions 32 so as to overlap the plurality of module body portions 32, as seen in the first direction. The capacitor busbars 42 extend toward the other side in the first direction from the capacitor body portion 4a toward the plurality of module body portions 32, as seen in the normal direction. With this structure, the capacitor body portion 4a is located closely to the power modules 3, whereby the capacitor body portion 4a and the power modules 3 can be connected to each other with low wiring inductances. Since the capacitor body portion 4a and the power modules 3 can be connected to each other with low wiring inductances, generation of extra loss in the capacitor busbars 42 connecting the capacitor body portion 4a and the power modules 3 can be suppressed. Since generation of loss is suppressed, heat generation due to Joule heat of the capacitor busbars 42 is suppressed, whereby the capacitor elements 41 can be protected from temperature increase.

As the capacitor busbars 42, a first capacitor busbar and a second capacitor busbar are provided. One of the first capacitor busbar and the second capacitor busbar is a positive busbar 42a, and the other of the first capacitor busbar and the second capacitor busbar is a negative busbar 42b. The positive busbar 42a is connected to the power terminal 31 for the positive side, and the negative busbar 42b is connected to the power terminal 31 for the negative side.

The capacitor element 41 has a first electrode which is the capacitor electrode 43 connected to the first capacitor busbar, and a second electrode which is the capacitor electrode 43 connected to the second capacitor busbar. One of the first electrode and the second electrode is located on a side of the capacitor element 41 toward the bottom wall 45b of the capacitor case 45, and the other of the first electrode and the second electrode is located on a side of the capacitor element 41 toward the opening 45a of the capacitor case 45. In the present embodiment, the one of the first electrode and the second electrode is a bottom-wall-side electrode 43b, and the other of the first electrode and the second electrode is an open-side electrode 43a. In the sealing resin 44, the negative busbar 42b is connected to the bottom-wall-side electrode 43b, and the positive busbar 42a is connected to the open-side electrode 43a. Although, in the present embodiment, the open-side electrode 43a is the positive electrode and the bottom-wall-side electrode 43b is the negative electrode, either the open-side electrode 43a or the bottom-wall-side electrode 43b may be the positive electrode. The capacitor busbar 42 connected to the positive electrode is the positive busbar 42a, and the capacitor busbar 42 connected to the negative electrode is the negative busbar 42b.

As shown in FIG. 1, the capacitor module 4 has the power-supply-side terminals 46 each having one end extending outward from the capacitor case 45 and electrically connected to the DC power supply 7. Another end of each power-supply-side terminal 46 is connected to the positive busbar 42a or the negative busbar 42b in the sealing resin 44. The power-supply-side terminals 46 are made of copper which is small in electric resistivity and excellent in electric conductivity, for example.

As shown in FIG. 2, the exposed portion 42d of the capacitor busbar 42 extends toward the outer side of the peripheral wall of the capacitor case 45, then extends along the outer surface of the peripheral wall of the capacitor case 45 toward the second surface 2b, and further extends along the first surface 2a toward the module body portion 32. With this structure, the length of the capacitor busbar 42 can be shortened. Since the length of the capacitor busbar 42 is shortened, the capacitor body portion 4a and the power module 3 can be connected to each other with a low wiring inductance, whereby generation of extra loss in the capacitor busbar 42 connecting the capacitor body portion 4a and the power module 3 can be suppressed. In addition, the distance between a heat dissipation portion 42e of the capacitor busbar 42 described later and the capacitor element 41 connected to the capacitor busbar 42 can be shortened, whereby the capacitor element 41 can be efficiently cooled.

<Heat Dissipation from Capacitor Busbar 42>

Heat dissipation from the capacitor busbar 42, which is a major part of the present disclosure, will be described. The capacitor busbar 42 is thermally connected to the first surface 2a. In the present embodiment, as shown in FIG. 2, the capacitor busbar 42 is thermally connected to the first surface 2a via a heat transfer member 51, between the capacitor body portion 4a and the module body portion 32. A part of the capacitor busbar 42 that is thermally connected to the first surface 2a is the heat dissipation portion 42e. The heat transfer member 51 is thermosetting grease, a resin sheet, or a resin member surrounding the heat dissipation portion 42e.

With the capacitor busbar 42 thermally connected to the first surface 2a, generated heat of the capacitor busbar 42 itself and heat of the power module 3 which transfers from the power terminal 31 to the capacitor busbar 42 can be dissipated from the first surface 2a of the housing 2, whereby deterioration of the capacitor element due to heat can be suppressed. The location of the heat dissipation portion 42e is not limited to the part between the capacitor body portion 4a and the module body portion 32, but if the heat dissipation portion 42e is located between the capacitor body portion 4a and the module body portion 32, the length of the capacitor busbar 42 can be shortened. In addition, heat generated in the capacitor element 41 is dissipated from the second surface 2b of the housing 2 via the capacitor case 45, and also dissipated from the first surface 2a of the housing 2 via the heat dissipation portion 42e. Thus, the capacitor element 41 can be efficiently cooled from both of the bottom wall 45b side and the opening 45a side of the capacitor case 45, whereby deterioration of the capacitor element 41 due to heat can be suppressed.

Since the capacitor busbar 42 is thermally connected to the first surface 2a via the heat transfer member 51, generated heat of the capacitor busbar 42 itself and heat of the power module 3 which transfers to the capacitor busbar 42 can be efficiently dissipated from the first surface 2a. In a case where the capacitor busbar 42 and the housing 2 need to be insulated from each other, in a conventional structure, the capacitor busbar 42 and the housing 2 need to be located away from each other by a sufficient distance, for ensuring an insulation distance. This leads to a problem that the size of the power conversion device increases or the wiring is extended so that the wiring inductance increases, thus generating extra loss in the capacitor busbar. On the other hand, in the present embodiment, by using a resin sheet having high insulating property as the heat transfer member 51, even in a case where the capacitor busbar 42 and the housing 2 need to be insulated from each other, it is possible to locate the capacitor busbar 42 and the housing 2 sufficiently closely to each other while ensuring insulation between the capacitor busbar 42 and the housing 2, whereby the power conversion device 1 can be downsized. In addition, by using an elastic material as the resin sheet, vibration resistance of the power conversion device 1 can be improved.

In a case where grease is used as the heat transfer member 51, since grease exhibits high adhesion with the capacitor busbar 42 and the first surface 2a, a gap is less likely to be formed between the capacitor busbar 42 and the first surface 2a, and thus increase in thermal resistance between the capacitor busbar 42 and the first surface 2a can be suppressed. In a case where a resin member surrounding the heat dissipation portion 42e is used as the heat transfer member 51, the heat transfer member 51 can be formed by integral molding with the capacitor busbar 42, whereby increase in the number of components for manufacturing the power conversion device 1 can be suppressed. In addition, productivity of the power conversion device 1 can be improved.

The upstream-side path 21a is located so as to overlap the heat dissipation portion 42e which is a part of the capacitor busbar 42 that is thermally connected to the first surface 2a, as seen in the normal direction. With this structure, heat generated in the capacitor element 41, generated heat of the capacitor busbar 42 itself, and heat of the power module 3 which transfers from the power terminal 31 to the capacitor busbar 42 can be efficiently dissipated from the first surface 2a of the housing 2, whereby deterioration of the capacitor element 41 due to heat can be suppressed. In addition, the exposed portion 42d of the capacitor busbar 42 extends along the outer surface of the peripheral wall of the capacitor case 45 toward the second surface 2b and further extends along the first surface 2a toward the module body portion 32. Therefore, the heat transfer member 51 can be thinned, whereby the effect of heat dissipation at the heat dissipation portion 42e can be improved.

As the capacitor busbars 42, the first capacitor busbar connected to the first electrode of the capacitor element 41 and the second capacitor busbar connected to the second electrode of the capacitor element 41 are provided. One or both of the first capacitor busbar and the second capacitor busbar are thermally connected to the first surface 2a. In the present embodiment, one of the first capacitor busbar and the second capacitor busbar is the positive busbar 42a, the other of the first capacitor busbar and the second capacitor busbar is the negative busbar 42b, and both of the positive busbar 42a and the negative busbar 42b are thermally connected to the first surface 2a. In a case where both of the first capacitor busbar and the second capacitor busbar are thermally connected to the first surface 2a, heat generated in the capacitor element 41, generated heat of each capacitor busbar 42 itself, and heat of the power module 3 which transfers from the power terminal 31 to the capacitor busbar 42 can be efficiently dissipated from the first surface 2a of the housing 2. In view of arrangement of the capacitor busbars 42, or the like, one of the first capacitor busbar and the second capacitor busbar may be thermally connected to the first surface 2a.

As described above, the power conversion device 1 according to the first embodiment includes: the power module 3 including the module body portion 32 storing a semiconductor element, and the power terminal 31 protruding from the module body portion 32; the capacitor module 4 including the capacitor body portion 4a storing the capacitor element 41, and the capacitor busbar 42 protruding from the capacitor body portion 4a and connected to the power terminal 31; and the housing 2 storing the power module 3 and the capacitor module 4. The housing 2 has the first surface 2a to which the power module 3 is thermally connected and the second surface 2b to which the capacitor module 4 is thermally connected. The coolant path 21 for cooling the first surface 2a is provided on the back side of the first surface 2a. The capacitor busbar 42 is thermally connected to the first surface 2a. Thus, heat generated in the capacitor element 41 is dissipated from the second surface 2b of the housing 2 via the capacitor case 45, and also dissipated from the first surface 2a of the housing 2 via the heat dissipation portion 42e. Therefore, the capacitor element 41 can be efficiently cooled from both of the bottom wall 45b side and the opening 45a side of the capacitor case 45, whereby deterioration of the capacitor element 41 due to heat can be suppressed. In addition, generated heat of the capacitor busbar 42 itself and heat of the power module 3 which transfers from the power terminal 31 to the capacitor busbar 42 can be dissipated from the first surface 2a of the housing 2, whereby deterioration of the capacitor element 41 due to heat can be suppressed.

The capacitor busbar 42 may be thermally connected to the first surface 2a via the heat transfer member 51, between the capacitor body portion 4a and the module body portion 32. In this case, heat generated in the capacitor element 41, generated heat of the capacitor busbar 42 itself, and heat of the power module 3 which transfers from the power terminal 31 to the capacitor busbar 42 can be efficiently dissipated from the first surface 2a of the housing 2, whereby deterioration of the capacitor element 41 due to heat can be suppressed.

The part of the housing 2 that has the first surface 2a may be the base portion 22 formed in a plate shape. The cooling fin 22a may be provided on the back surface of the base portion 22. The coolant path 21 may include the intermediate path 21c in which the coolant flows through the cooling fin from the one side in the first direction to the other side in the first direction, the upstream-side path 21a connected to the one side in the first direction of the intermediate path 21c and extending in the second direction, and the downstream-side path 21b connected to the other side in the first direction of the intermediate path 21c and extending in the second direction. The upstream-side path 21a may be located so as to overlap the area between the module body portion 32 and the capacitor body portion 4a, as seen in the normal direction. In this case, the coolant having a low temperature before cooling the power module 3 flows in the upstream-side path 21a, and therefore the second surface 2b located adjacently to the first surface 2a is also efficiently cooled by the upstream-side path 21a, whereby the upstream-side path 21a can cool the capacitor module 4 thermally connected to the second surface 2b.

The upstream-side path 21a may be located so as to overlap the part of the capacitor busbar 42 that is thermally connected to the first surface 2a, as seen in the normal direction. In this case, heat generated in the capacitor element 41, generated heat of the capacitor busbar 42 itself, and heat of the power module 3 which transfers from the power terminal 31 to the capacitor busbar 42 can be efficiently dissipated from the first surface 2a of the housing 2, whereby deterioration of the capacitor element 41 due to heat can be suppressed.

The capacitor busbar 42 may have the exposed portion 42d protruding from the sealing resin 44, at an opening part of the capacitor case 45 on a side opposite to the bottom wall 45b. The exposed portion 42d may extend toward the outer side of the peripheral wall of the capacitor case 45, then extend along the outer surface of the peripheral wall of the capacitor case 45 toward the second surface 2b, and further extend along the first surface 2a toward the module body portion 32. In this case, since the length of the capacitor busbar 42 is shortened, the capacitor body portion 4a and the power module 3 can be connected to each other with a low wiring inductance, whereby generation of extra loss in the capacitor busbar 42 connecting the capacitor body portion 4a and the power module 3 can be suppressed. In addition, the distance between the heat dissipation portion 42e and the capacitor element 41 connected to the capacitor busbar 42 can be shortened, whereby the capacitor element 41 can be efficiently cooled.

As the capacitor busbar 42, the first capacitor busbar connected to the first electrode of the capacitor element 41 and the second capacitor busbar connected to the second electrode of the capacitor element 41 may be provided. One or both of the first capacitor busbar and the second capacitor busbar may be thermally connected to the first surface 2a. In this case, heat generated in the capacitor element 41, generated heat of the capacitor busbar 42 itself, and heat of the power module 3 which transfers from the power terminal 31 to the capacitor busbar 42 can be efficiently dissipated from the first surface 2a of the housing 2.

A plurality of the module body portions 32 may be provided so as to be arranged in the second direction. The capacitor module 4 may be located on the one side in the first direction of the plurality of module body portions 32 so as to overlap the plurality of module body portions 32, as seen in the first direction. The capacitor busbar 42 may extend toward the other side in the first direction from the capacitor body portion 4a toward the plurality of module body portions 32, as seen in the normal direction. In this case, since the capacitor body portion 4a is located closely to the power module 3, the capacitor body portion 4a and the power module 3 can be connected to each other with a low wiring inductance, whereby generation of extra loss in the capacitor busbar 42 connecting the capacitor body portion 4a and the power module 3 can be suppressed.

The heat transfer member 51 may be grease, a resin sheet, or a resin member surrounding a part of the capacitor busbar 42 that is thermally connected to the first surface 2a. In this case, it is possible to efficiently transfer heat from the capacitor busbar 42 to the housing 2 while insulating the capacitor busbar 42 and the housing 2 from each other.

Second Embodiment

Figure 5:
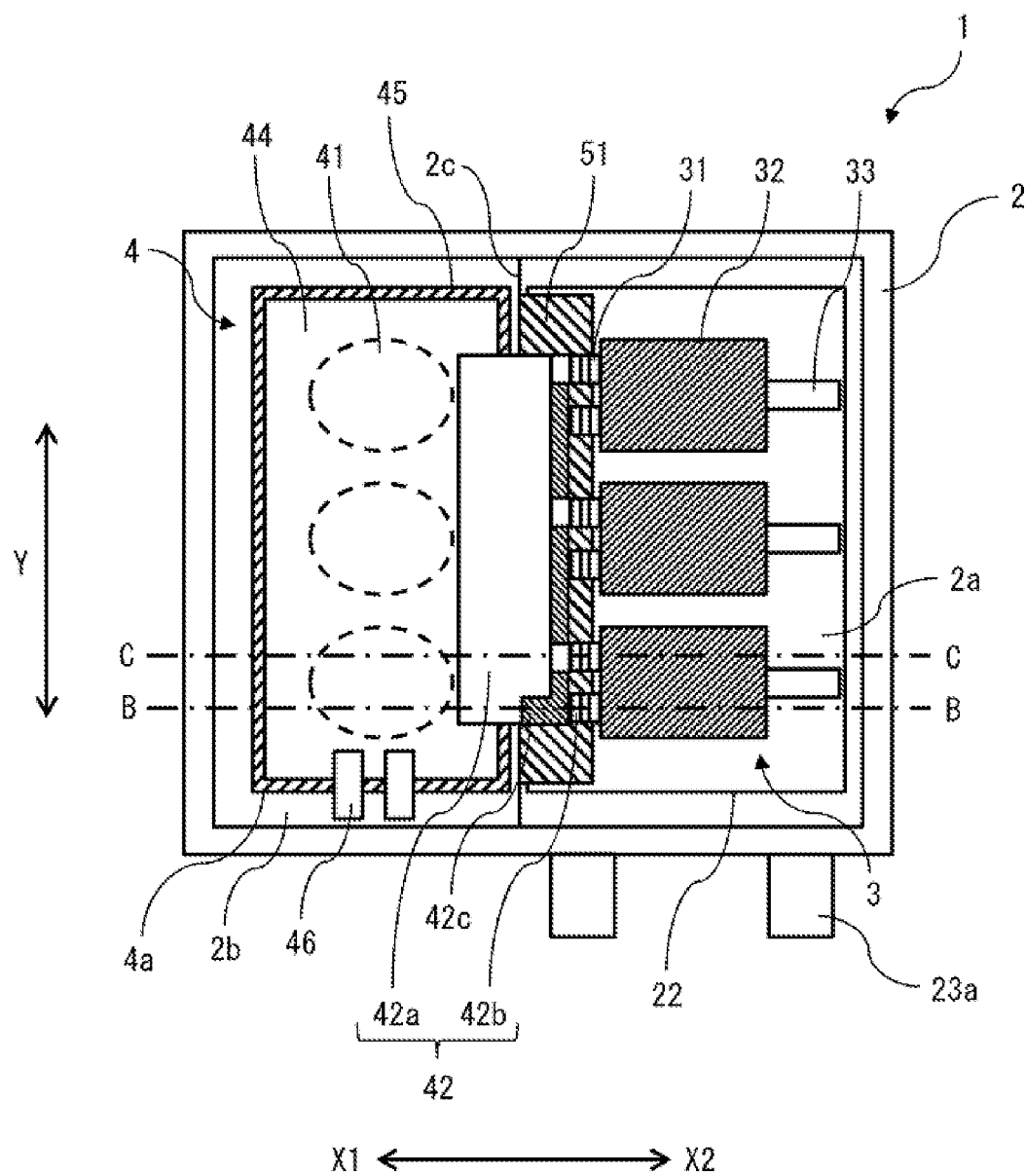
FIG. 5 is a plan view schematically showing a power conversion device according to the second embodiment of the present disclosure.
Figure 6:
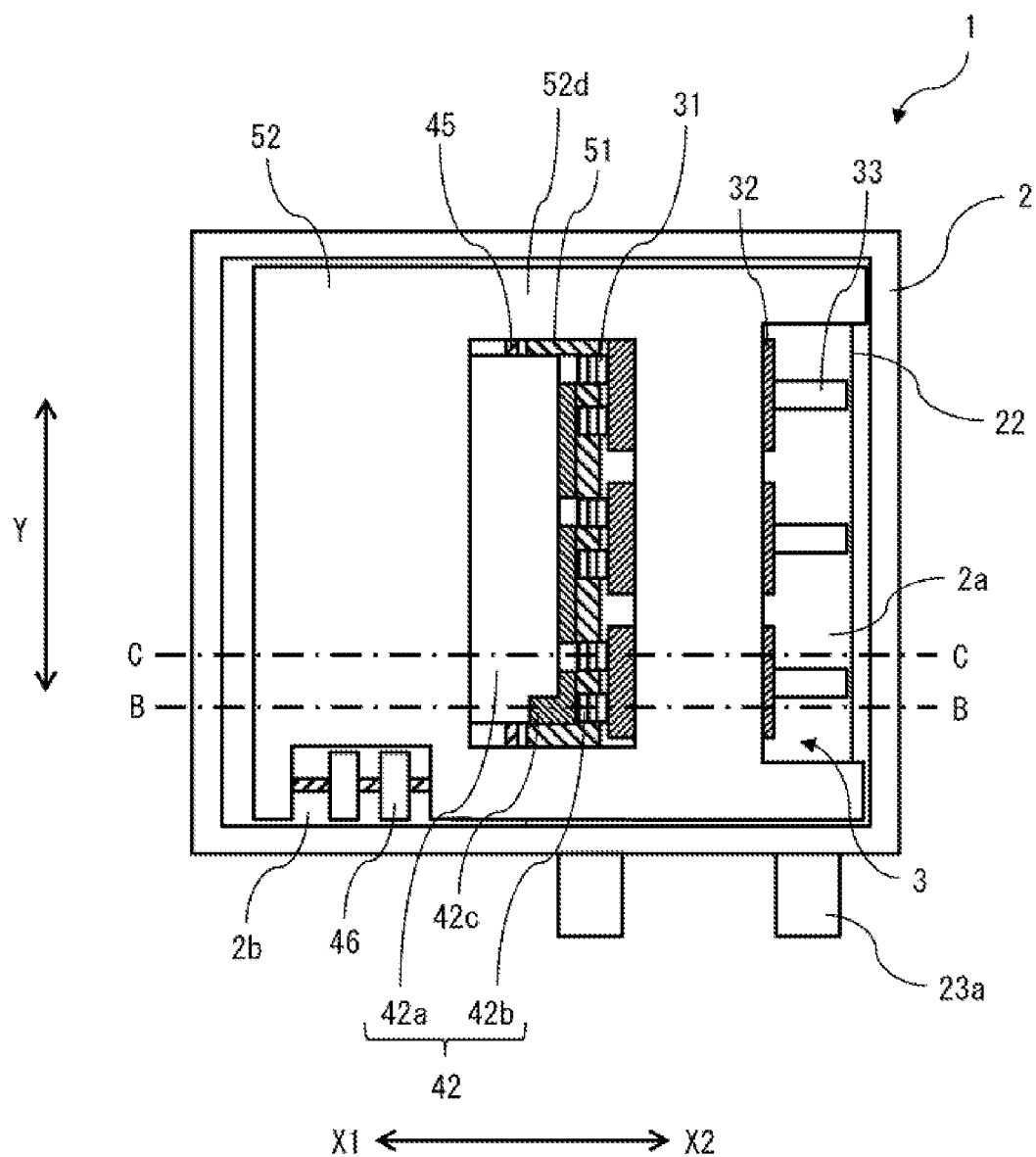
FIG. 6 is another plan view schematically showing the power conversion device according to the second embodiment.
Figure 7:
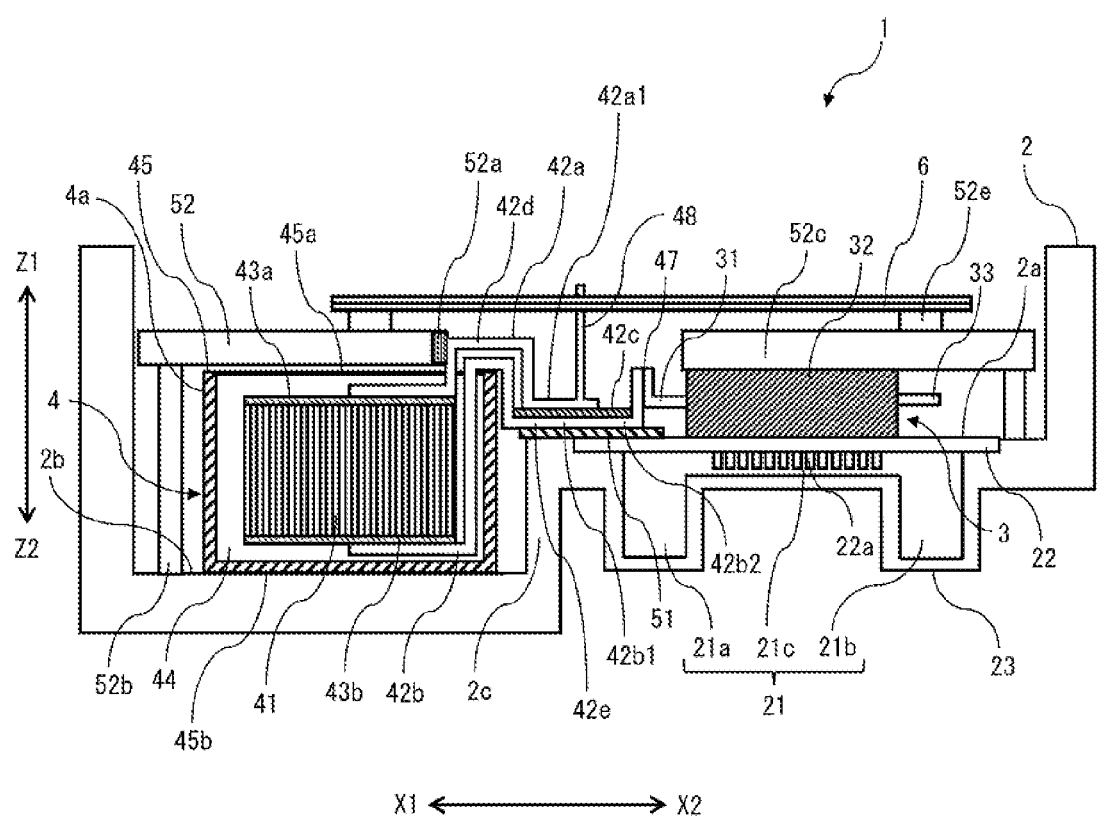
FIG. 7 is a sectional view of the power conversion device taken at a B-B cross-section position in FIG. 5.
Figure 8:
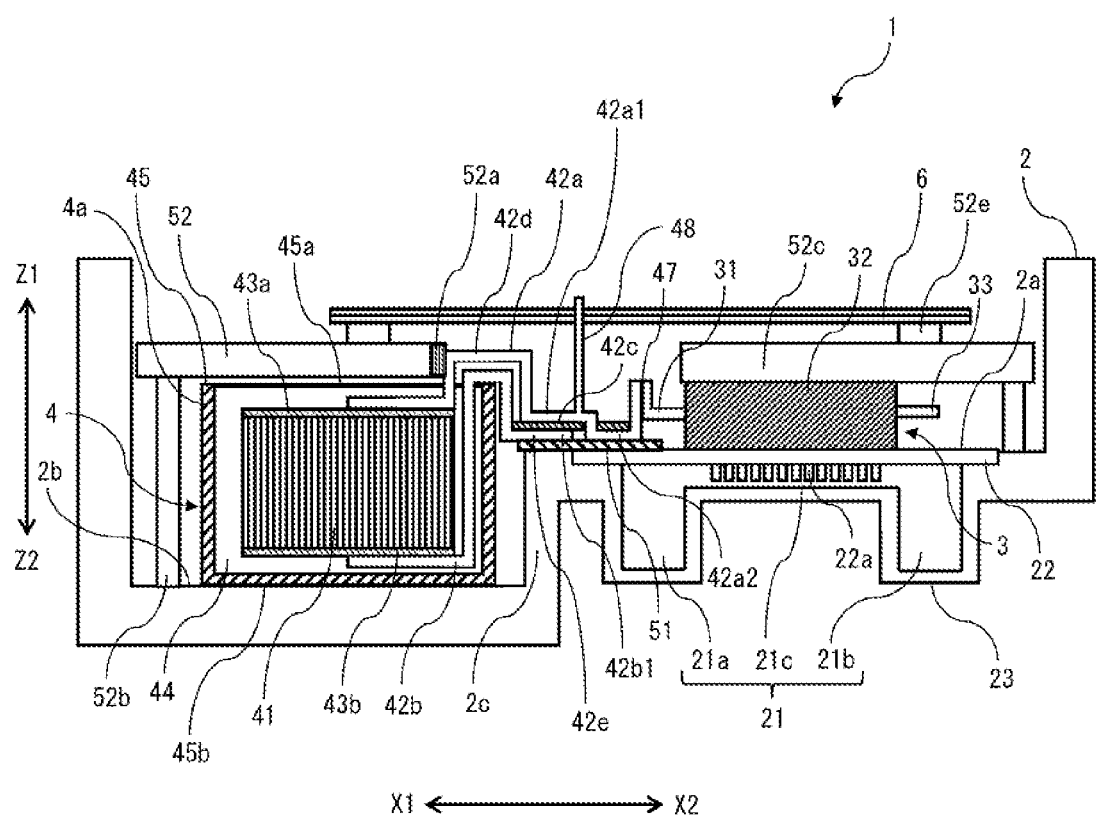
FIG. 8 is a sectional view of the power conversion device taken at a C-C cross-section position in FIG. 5.

A power conversion device 1 according to the second embodiment will be described. FIG. 5 is a plan view schematically showing the power conversion device 1 according to the second embodiment, in a state in which a control board 6 and an additional heat transfer member 52 are removed. FIG. 6 is another plan view schematically showing the power conversion device 1 in a state in which the control board 6 is removed. FIG. 7 is a sectional view of the power conversion device 1 taken at a B-B cross-section position in FIG. 5. FIG. 8 is a sectional view of the power conversion device 1 taken at a C-C cross-section position in FIG. 5. In FIG. 7 and FIG. 8, the control board 6 and the additional heat transfer member 52 are not removed. The power conversion device 1 according to the second embodiment includes the control board 6 and the additional heat transfer member 52, and the housing 2 has a step portion 2c.
<Step Portion 2c>

As shown in FIG. 7, the second surface 2b faces in the normal direction and is located on the one side in the first direction of the first surface 2a and on the normal-opposite-direction side relative to the first surface 2a. The housing 2 has the step portion 2c between the first surface 2a and the second surface 2b. The coolant path 21 is located on the other side in the first direction of the step portion 2c. The structure of the coolant path 21 is the same as the structure shown in FIG. 2 in the first embodiment.

With the above structure, the step portion 2c is provided so that the positions in the normal direction of the capacitor busbar 42 and the power terminal 31 respectively protruding from the capacitor body portion 4a and the module body portion 32 at different heights match each other, whereby the length of the capacitor busbar 42 can be shortened. Since the length of the capacitor busbar 42 is shortened, the capacitor body portion 4a and the power module 3 can be connected to each other with a low wiring inductance, whereby generation of extra loss in the capacitor busbar 42 connecting the capacitor body portion 4a and the power module 3 can be suppressed. In addition, the distance between the heat dissipation portion 42e and the capacitor element 41 connected to the capacitor busbar 42 can be shortened, whereby the capacitor element 41 can be efficiently cooled.

In addition, the coolant path 21 is located in an extra space present on the normal-opposite-direction side relative to the first surface 2a and on the other side in the first direction of the step portion 2c. Thus, the height of the power conversion device 1 is lowered and the power conversion device 1 is downsized, whereby the output density of the power conversion device 1 can be increased. In addition, since both headers 23a can be arranged side by side with the step portion 2c, the power conversion device 1 can be downsized. In addition, since the coolant having a temperature increased by heat of the power module 3 via the cooling fin 22a passes through the downstream-side path 21b, the downstream-side path 21b is located at a position away from the capacitor module 4, and the upstream-side path 21a is located on a side close to the capacitor module 4, whereby the capacitor module 4 can be efficiently cooled. With the step portion 2c provided, the upstream-side path 21a becomes closer to the capacitor module 4 than in the structure of the first embodiment, whereby the capacitor module 4 can be more efficiently cooled.

Figure 9:
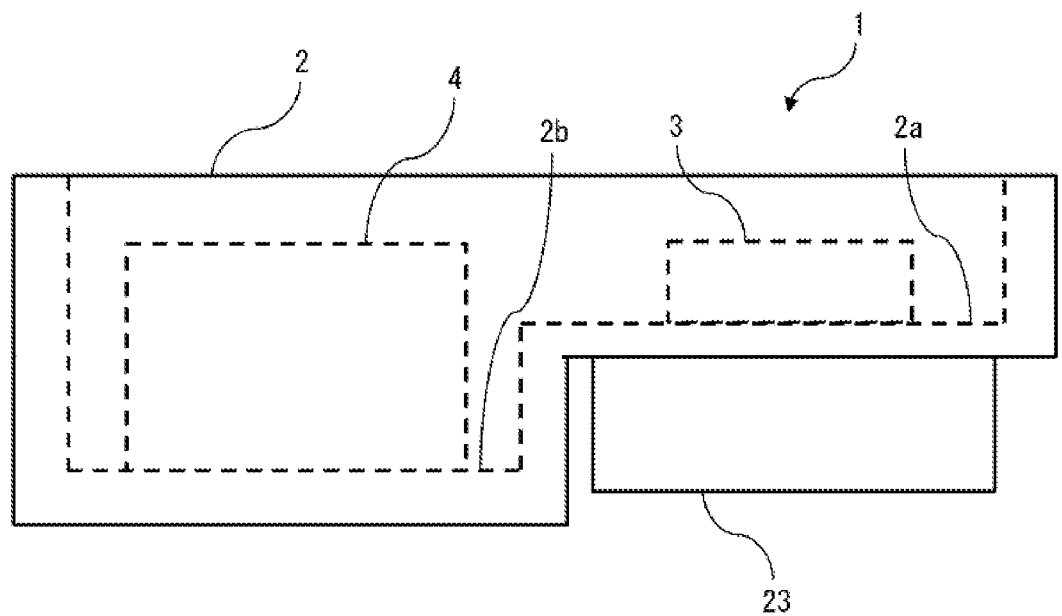
FIG. 9 is a side view schematically showing another power conversion device according to the second embodiment.

The structure of the path forming portion 23 is not limited to the structure shown in FIG. 7, and may be a structure shown in FIG. 9. FIG. 9 is a side view schematically showing another power conversion device 1 according to the second embodiment. The housing 2 shown in FIG. 9 does not have the base portion 22, and the housing 2 has the first surface 2a and the second surface 2b at the inner surface of the bottom wall of the housing 2. The housing 2 has the path forming portion 23 at the outer surface of the bottom wall of the housing 2 on the back side of the first surface 2a. In FIG. 9, the headers 23a are not shown. Also with this structure, the first surface 2a can be cooled by the coolant path provided in the path forming portion 23.
<Control Board 6>

The power conversion device 1 includes the control board 6 for controlling the power module 3. The control board 6 is provided with a control circuit for controlling the power module 3. The control board 6 and the power module 3 are connected to each other via the plurality of control terminals (not shown) provided to the power module 3. The position in the normal direction of an end on the normal-direction side of the capacitor body portion 4a and the position in the normal direction of an end on the normal-direction side of the module body portion 32 are equivalent to each other. Here, the term "equivalent" means that the position in the normal direction of the capacitor body portion 4a is within 10% of the normal-direction width of the module body portion 32 from the position in the normal direction of the module body portion 32. The control board 6 is provided on the normal-direction side relative to the capacitor module 4 and the power module 3. The control board 6 overlaps both of the capacitor module 4 and the power module 3, as seen in the normal direction.

While the control board 6 connected to the control terminals is located near the power module 3, the projected area of the control board 6 might be limited depending on a comparatively large-sized component such as the capacitor module 4. In this case, for example, the control circuit is divided into a plurality of control boards and the plurality of control boards are arranged in a stacked manner, so that the layout of the control board 6 is complicated. With the structure shown in the present embodiment, the control board 6 can be located so as to overlap both of the capacitor module 4 and the power module 3, as seen in the normal direction, irrespective of the size of the capacitor module 4. Thus, the area where the control board 6 is located can be sufficiently ensured and the layout of the control board 6 can be prevented from being complicated.
<Additional Heat Transfer Member 52>

The power conversion device 1 includes the additional heat transfer member 52. The additional heat transfer member 52 is provided on the normal-direction side relative to the capacitor body portion 4a and is thermally connected to the exposed portion 42d of the capacitor busbar 42. In the present embodiment, the additional heat transfer member 52 is made of metal such as aluminum. The additional heat transfer member 52 is not limited to metal, and may be a resin sheet or a resin member surrounding the exposed portion 42d part. In a case where the additional heat transfer member 52 is made of metal, the additional heat transfer member 52 and the exposed portion 42d are thermally connected to each other via a resin protection portion 52a. By providing the resin protection portion 52a, the additional heat transfer member 52 and the exposed portion 42d are insulated from each other. In addition, by providing the resin protection portion 52a, the exposed portion 42d can be protected from being damaged by contact between the exposed portion 42d and the additional heat transfer member 52, or the like.

The additional heat transfer member 52 is thermally connected to the housing 2. In the present embodiment, the additional heat transfer member 52 has a leg 52b thermally connected to the inner surface of the bottom wall of the housing 2. The additional heat transfer member 52 is, at the leg 52b, thermally connected to the housing 2 and fixed to the housing 2. The thermal connection between the additional heat transfer member 52 and the housing 2 is not limited to connection using the leg 52b, and the additional heat transfer member 52 may be thermally connected to a side wall of the housing 2 and fixed to the side wall. The additional heat transfer member 52 may be thermally connected to a top plate (not shown) covering an opening part on the normal-direction side of the housing 2 and may be fixed to the top plate. The additional heat transfer member 52 may be supported by a support portion provided to the housing 2, so as to be fixed to the housing 2. The additional heat transfer member 52 is not limited to such a structure as to be thermally connected to the housing 2, and may have a structure for dissipating heat to the air. An additional cooler may be provided on the normal-direction side of the housing 2, and the additional cooler and the additional heat transfer member 52 may be thermally connected to each other. The leg 52b may be made of the same material as the body part of the additional heat transfer member 52 or may be made of a different material.

With the above structure, the additional heat transfer member 52 is located more closely to the capacitor element 41 than the heat dissipation portion 42e is. Thus, the heat dissipation path for the capacitor element 41 is shortened, whereby deterioration of the capacitor element 41 due to heat can be further suppressed. In a case where the additional heat transfer member 52 is thermally connected to the housing 2, heat of the additional heat transfer member 52 is dissipated to the housing 2, whereby deterioration of the capacitor element 41 due to heat can be further suppressed. In a case where the additional heat transfer member 52 is metal, a material having high thermal conductivity can be used, whereby the capacitor element 41 can be efficiently cooled. In a case where a resin sheet is used as the additional heat transfer member 52, insulation between the capacitor busbar 42 and the housing 2 can be easily ensured. In a case where a resin member surrounding the exposed portion 42d part is used as the additional heat transfer member 52, the additional heat transfer member 52 can be formed by integral molding with the capacitor busbar 42, whereby increase in the number of components for manufacturing the power conversion device 1 can be suppressed. In addition, productivity of the power conversion device 1 can be improved.

The additional heat transfer member 52 has a part extending toward the power module 3 side and thermally connected to the module body portion 32. In FIG. 7, a power module connection portion 52c is a part of the additional heat transfer member 52 that is thermally connected to the module body portion 32. In FIG. 6, an extending portion 52d is a part of the additional heat transfer member 52 that extends toward the power module 3 side. With this structure, heat generated in the power module 3 can be dissipated also from the normal-direction side of the module body portion 32, whereby heat of the power module 3 which transfers to the capacitor busbar 42 can be reduced. A part of the power module 3 to which the additional heat transfer member 52 is thermally connected is not limited to the module body portion 32, and may be the power terminal 31. In a case where the additional heat transfer member 52 is metal, the additional heat transfer member 52 and the power terminal 31 are thermally connected to each other via a resin protection portion. A center part of the additional heat transfer member 52 is opened so that the terminals connected to the control board 6 do not interfere therewith.

In the present embodiment, the additional heat transfer member 52 is provided between the control board 6, and the capacitor body portion 4a and the module body portion 32, and is thermally connected to the capacitor module 4 and the power module 3. The additional heat transfer member 52 has a board support portion 52e supporting the control board 6, on the normal-direction side. With this structure, vibration applied to the control board 6 can be suppressed. In addition, if a discharge resistor circuit in the control board 6 for discharging electric charge accumulated in the capacitor module 4 is thermally connected to the additional heat transfer member 52, heat to be transferred from the discharge resistor to the capacitor module 4 can be dissipated to the housing 2, whereby deterioration of the capacitor element 41 can be suppressed.

As in the first embodiment, the exposed portion 42d of the capacitor busbar 42 extends toward the outer side of the peripheral wall of the capacitor case 45, then extends along the outer surface of the peripheral wall of the capacitor case 45 toward the second surface 2b, and further extends along the first surface 2a toward the module body portion 32. With this structure, the heat transfer member 51 can be thinned while the position in the normal direction of the end on the normal-direction side of the capacitor body portion 4a and the position in the normal direction of the end on the normal-direction side of the module body portion 32 are kept equivalent to each other, without changing the normal-direction size of the step portion 2c. Thus, the effect of heat dissipation at the heat dissipation portion 42e can be improved.

<Insulating Member 42c>

The first capacitor busbar has a first opposed portion opposed to the second capacitor busbar in the normal direction or the normal opposite direction, and a first non-opposed portion which extends from the first opposed portion toward the module body portion 32 side and is not opposed to the second capacitor busbar in the normal direction and the normal opposite direction. The second capacitor busbar has a second opposed portion opposed to the first capacitor busbar in the normal direction or the normal opposite direction, and a second non-opposed portion which extends from the second opposed portion toward the module body portion 32 side and is not opposed to the first capacitor busbar in the normal direction and the normal opposite direction. In the present embodiment, the positive busbar 42a is the first capacitor busbar, and the negative busbar 42*b* is the second capacitor busbar. A first opposed portion 42*a*1 and a second opposed portion 42*b*1 are thermally connected to each other via an insulating member 42*c*, and one of the first opposed portion 42*a*1 and the second opposed portion 42*b*1 that is closer to the first surface 2*a* is thermally connected to the first surface 2*a*. In the present embodiment, as shown in FIG. 7, the second opposed portion 42*b*1 of the negative busbar 42*b* is thermally connected to the first surface 2*a*. One or both of the first non-opposed portion and the second non-opposed portion are thermally connected to the first surface 2*a*. In the present embodiment, both of the first non-opposed portion and the second non-opposed portion are thermally connected to the first surface 2*a*. In the cross-section shown in FIG. 7, a second non-opposed portion 42*b*2 is thermally connected to the first surface 2*a*, and in the cross-section shown in FIG. 8, a first non-opposed portion 42*a*2 is thermally connected to the first surface 2*a*. The insulating member 42*c* is, for example, a resin sheet.

With the above structure, wiring inductances are canceled by each other in an area where the first opposed portion 42*a*1 and the second opposed portion 42*b*1 are present, whereby the wiring inductances of the capacitor busbars 42 can be significantly reduced. In addition, while the width of the capacitor busbar 42 is kept wide, the capacitor busbar 42 can be extended to the heat dissipation portion 42*e* thermally connected to the heat transfer member 51. Thus, the heat dissipation area is increased, whereby a high cooling effect at the heat dissipation portion 42*e* can be obtained. Since the positive busbar 42*a* and the negative busbar 42*b* can be thermally connected to each other via the insulating member 42*c*, both of the positive busbar 42*a* and the negative busbar 42*b* can be efficiently cooled.

The capacitor body portion 4*a* includes a plurality of the capacitor elements 41 arranged in the second direction. The first opposed portion 42*a*1 extends in the second direction so as to connect the first electrodes of the plurality of capacitor elements 41 to each other, and the second opposed portion 42*b*1 extends in the second direction so as to connect the second electrodes of the plurality of capacitor elements 41 to each other. With this structure, the power conversion device 1 can be downsized in the first direction. In addition, since the first-direction length of the capacitor busbar 42 is shortened, the capacitor body portion 4*a* and the power module 3 can be connected to each other with a low wiring inductance, whereby generation of extra loss in the capacitor busbar 42 connecting the capacitor body portion 4*a* and the power module 3 can be suppressed.

In the power conversion device 1, an N number of the module body portions 32 are provided so as to be arranged in the second direction, N being an integer not less than 2. In the present embodiment, as shown in FIG. 5, three module body portions 32 are provided in the power conversion device 1. In the capacitor busbars 42, an N number of the first non-opposed portions and an N number of the second non-opposed portions are provided so as to be arranged in the second direction and extend toward the other side in the first direction. The two power terminals 31 of each of the N number of module body portions 32 are connected to the corresponding one of the first non-opposed portions and the corresponding one of the second non-opposed portions. With this structure, the power conversion device 1 can be downsized in the first direction. In addition, since the first-direction length of the capacitor busbar 42 is shortened, the capacitor body portion 4*a* and the power module 3 can be connected to each other with a low wiring inductance, whereby generation of extra loss in the capacitor busbar 42 connecting the capacitor body portion 4*a* and the power module 3 can be suppressed.

<Board Connection Terminal 48>

The capacitor busbar 42 has a board connection terminal 48 extending in the normal direction from the heat dissipation portion 42*e* which is a part thermally connected to the first surface 2*a*, the board connection terminal 48 being electrically and thermally connected to the control board 6. The board connection terminal 48 is another control terminal different from the control terminals provided so as to protrude outward from the module body portion 32, and is a DESAT terminal connected to a driver circuit in the control board 6 for supplying power to the power module 3. In the present embodiment, the board connection terminal 48 is formed at the positive busbar 42*a*. In FIG. 5 and FIG. 6, the board connection terminal 48 is not shown. The capacitor busbar 42 has an end connected to the capacitor electrode 43, the board connection terminal 48, the power terminal connection portion 47 connected to the power terminal 31, and a part connected to the power-supply-side terminal 46. The capacitor busbar 42 does not need relay components such as a connector and a terminal for electric connection of each part. Therefore, size increase of the power conversion device 1 can be suppressed. In addition, since such relay components are not needed, wiring inductance increase due to addition of connector and terminal parts can be suppressed.

Since the board connection terminal 48 is formed at the capacitor busbar 42, it is not necessary to form the board connection terminal 48 at the lead frame supporting the power terminals 31 and the like. Therefore, the occupying widths of the power terminals 31 in the area of the lead frame can be expanded. Since the widths of the power terminals 31 are expanded, the wiring inductances of the power terminals 31 can be reduced.

The board connection terminal 48 formed at the heat dissipation portion 42*e* of the capacitor busbar 42 is thermally connected to the first surface 2*a* via the heat dissipation portion 42*e* and the heat transfer member 51. Therefore, heat generated in the driver circuit can be dissipated to the housing 2 via the board connection terminal 48. Since heat generated in the driver circuit is dissipated to the housing 2, heat that the capacitor module 4 receives from the driver circuit through the air around the driver circuit can be reduced.

As described above, in the power conversion device 1 according to the second embodiment, the second surface 2*b* faces in the normal direction and is located on the one side in the first direction of the first surface 2*a* and on the normal-opposite-direction side relative to the first surface 2*a*. The housing 2 has the step portion 2*c* between the first surface 2*a* and the second surface 2*b*. The coolant path 21 is located on the other side in the first direction of the step portion 2*c*. Thus, the step portion 2*c* is provided so that the positions in the normal direction of the capacitor busbar 42 and the power terminal 31 respectively protruding from the capacitor body portion 4*a* and the module body portion 32 at different heights match each other, whereby the length of the capacitor busbar 42 can be shortened. In addition, the coolant path 21 is located in an extra space present on the normal-opposite-direction side relative to the first surface 2*a* and on the other side in the first direction of the step portion 2*c*. Thus, the height of the power conversion device 1 is lowered and the power conversion device 1 is downsized, whereby the output density of the power conversion device 1 can be increased. In addition, with the step portion 2*c* provided, the upstream-side path 21*a* becomes closer to the capacitor module 4 than in the structure of the first embodiment, whereby the capacitor module 4 can be more efficiently cooled.

The first capacitor busbar may have the first opposed portion opposed to the second capacitor busbar in the normal direction or the normal opposite direction, and the first non-opposed portion which extends from the first opposed portion toward the module body portion 32 side and is not opposed to the second capacitor busbar in the normal direction and the normal opposite direction. The second capacitor busbar may have the second opposed portion opposed to the first capacitor busbar in the normal direction or the normal opposite direction, and the second non-opposed portion which extends from the second opposed portion toward the module body portion 32 side and is not opposed to the first capacitor busbar in the normal direction and the normal opposite direction. The first opposed portion and the second opposed portion may be thermally connected to each other via the insulating member 42c, and one of the first opposed portion and the second opposed portion that is closer to the first surface 2a may be thermally connected to the first surface 2a. One or both of the first non-opposed portion and the second non-opposed portion may be thermally connected to the first surface 2a. In this case, wiring inductances are canceled by each other in an area where the first opposed portion and the second opposed portion are present, whereby the wiring inductances of the capacitor busbars 42 can be significantly reduced. In addition, while the width of the capacitor busbar 42 is kept wide, the capacitor busbar 42 can be extended to the heat dissipation portion 42e thermally connected to the heat transfer member 51. Thus, the heat dissipation area is increased, whereby a high cooling effect at the heat dissipation portion 42e can be obtained.

The capacitor body portion 4a may include a plurality of capacitor elements 41 arranged in the second direction. The first opposed portion 42a1 may extend in the second direction so as to connect the first electrodes of the plurality of capacitor elements 41 to each other. The second opposed portion 42b1 may extend in the second direction so as to connect the second electrodes of the plurality of capacitor elements 41 to each other. In this case, the power conversion device 1 can be downsized in the first direction. In addition, since the first-direction length of the capacitor busbar 42 is shortened, the capacitor body portion 4a and the power module 3 can be connected to each other with a low wiring inductance, whereby generation of extra loss in the capacitor busbar 42 connecting the capacitor body portion 4a and the power module 3 can be suppressed.

In the power conversion device 1, an N number of the module body portions 32 may be provided so as to be arranged in the second direction, N being an integer not less than 2. In the capacitor busbars 42, an N number of the first non-opposed portions and an N number of the second non-opposed portions may be provided so as to be arranged in the second direction and extend toward the other side in the first direction. The two power terminals 31 of each of the N number of module body portions 32 may be connected to the corresponding one of the first non-opposed portions and the corresponding one of the second non-opposed portions. In this case, the power conversion device 1 can be downsized in the first direction. In addition, since the first-direction length of the capacitor busbar 42 is shortened, the capacitor body portion 4a and the power module 3 can be connected to each other with a low wiring inductance, whereby generation of extra loss in the capacitor busbar 42 connecting the capacitor body portion 4a and the power module 3 can be suppressed.

The power conversion device 1 may further include the control board 6 for controlling the power module 3. The position in the normal direction of the end on the normal-direction side of the capacitor body portion 4a and the position in the normal direction of the end on the normal-direction side of the module body portion 32 may be equivalent to each other. The control board 6 may be provided on the normal-direction side relative to the capacitor module 4 and the power module 3. The control board 6 may overlap both of the capacitor module 4 and the power module 3, as seen in the normal direction. In this case, the control board 6 can be located so as to overlap both of the capacitor module 4 and the power module 3 irrespective of the size of the capacitor module 4. Thus, the area where the control board 6 is located can be sufficiently ensured and the layout of the control board 6 can be prevented from being complicated.

The capacitor busbar 42 may have the board connection terminal 48 extending in the normal direction from the heat dissipation portion 42e which is a part thermally connected to the first surface 2a, the board connection terminal 48 being electrically and thermally connected to the control board 6. In this case, it is not necessary to form the board connection terminal 48 at the lead frame supporting the power terminal 31 and the like. Therefore, the occupying widths of the power terminals 31 in the area of the lead frame can be expanded. Since the widths of the power terminals 31 are expanded, the wiring inductances of the power terminals 31 can be reduced. In addition, the board connection terminal 48 formed at the heat dissipation portion 42e of the capacitor busbar 42 is thermally connected to the first surface 2a via the heat dissipation portion 42e and the heat transfer member 51. Therefore, heat generated in the driver circuit of the control board 6 can be dissipated to the housing 2 via the board connection terminal 48.

The power conversion device 1 may further include the additional heat transfer member 52. The additional heat transfer member 52 may be provided on the normal-direction side relative to the capacitor body portion 4a and may be thermally connected to the exposed portion 42d of the capacitor busbar 42. In this case, the additional heat transfer member 52 is located more closely to the capacitor element 41 than the heat dissipation portion 42e is. Thus, the heat dissipation path for the capacitor element 41 is shortened, whereby deterioration of the capacitor element 41 can be further suppressed. In addition, the additional heat transfer member 52 may have a part extending toward the power module 3 side and thermally connected to the module body portion 32. In this case, heat generated in the power module 3 can be dissipated also from the normal-direction side of the module body portion 32, whereby heat of the power module 3 which transfers to the capacitor busbar 42 can be reduced.

The additional heat transfer member 52 may be thermally connected to the housing 2. In this case, heat of the additional heat transfer member 52 is dissipated to the housing 2, whereby deterioration of the capacitor element 41 due to heat can be further suppressed. In addition, the additional heat transfer member 52 may be provided between the control board 6, and the capacitor body portion 4a and the module body portion 32, and may be thermally connected to the capacitor module 4 and the power module 3. The additional heat transfer member 52 may have the board support portion 52e supporting the control board 6, on the normal-direction side. In this case, vibration applied to the control board 6 can be suppressed.

The additional heat transfer member 52 may be metal. In this case, a material having high thermal conductivity can be used, whereby the capacitor element 41 can be efficiently cooled. A resin sheet may be used as the additional heat transfer member 52. In this case, insulation between the capacitor busbar 42 and the housing 2 can be easily ensured. A resin member surrounding the exposed portion 42d part may be used as the additional heat transfer member 52. In this case, the additional heat transfer member 52 can be formed by integral molding with the capacitor busbar 42, whereby increase in the number of components for manufacturing the power conversion device 1 can be suppressed.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 power conversion device
2 housing
2a first surface
2b second surface
2c step portion
21 coolant path
21a upstream-side path
21b downstream-side path
21c intermediate path
22 base portion
22a cooling fin
23 path forming portion
23a header
3 power module
31 power terminal
32 module body portion
33 output terminal
4 capacitor module
4a capacitor body portion
41 capacitor element
42 capacitor busbar
42a positive busbar
42a1 first opposed portion
42a2 first non-opposed portion
42b negative busbar
42b1 second opposed portion
42b2 second non-opposed portion
42c insulating member
42d exposed portion
42e heat dissipation portion
43 capacitor electrode
43a open-side electrode
43b bottom-wall-side electrode
44 sealing resin
capacitor case
45a opening
45b bottom wall
46 power-supply-side terminal
47 power terminal connection portion
48 board connection terminal
51 heat transfer member
52 additional heat transfer member
52a resin protection portion
52b leg
52c power module connection portion
52d extending portion
52e board support portion
6 control board
7 DC power supply

What is claimed is:

1. A power conversion device comprising:
a power module including a module body portion storing a semiconductor element, and a power terminal protruding from the module body portion;
a capacitor module including a capacitor body portion storing a capacitor element, and a capacitor busbar protruding from the capacitor body portion and connected to the power terminal; and
a housing storing the power module and the capacitor module, wherein
the housing has a first surface to which the power module is thermally connected, and a second surface to which the capacitor module is thermally connected,
a coolant path transporting a fluid for cooling the first surface is provided on a back side of the first surface, the back side facing away from at least part of the capacitor busbar, and
the capacitor busbar is protruded from the capacitor module and, at a location outside of the capacitor module, thermally connected to the first surface by a layer of a heat transfer member at the location outside of the capacitor module and directly between and contacting both of the capacitor busbar and the first surface.

2. The power conversion device according to claim 1, wherein
the heat transfer member is located on the first surface, laterally between the capacitor body portion and the module body portion.

3. The power conversion device according to claim 1, wherein
a direction opposite to a normal direction of the first surface is defined as a normal opposite direction,
a specific direction parallel to the first surface is defined as a first direction, and a direction parallel to the first surface and perpendicular to the first direction is defined as a second direction,
the second surface faces in the normal direction and is located on one side in the first direction of the first surface and on the normal-opposite-direction side relative to the first surface,
the housing has a step portion between the first surface and the second surface, and
the coolant path is located on another side in the first direction of the step portion.

4. The power conversion device according to claim 1, wherein
a direction opposite to a normal direction of the first surface is defined as a normal opposite direction, a specific direction parallel to the first surface is defined as a first direction, and a direction parallel to the first surface and perpendicular to the first direction is defined as a second direction, a part of the housing that has the first surface is a base portion formed in a plate shape, a back surface of the base portion on a back side of the first surface forms a part of an inner surface of the coolant path, a cooling fin is provided on the back surface of the base portion in an area overlapping the module body portion, as seen in the normal direction, the coolant path includes an intermediate path in which a coolant flows through the cooling fin from one side in the first direction to another side in the first direction, an upstream-side path connected to the one side in the first direction of the intermediate path and extending in the second direction, and a downstream-side path connected to the other side in the first direction of the intermediate path and extending in the second direction, and the upstream-side path is located so as to overlap an area between the module body portion and the capacitor body portion, as seen in the normal direction.

5. The power conversion device according to claim 4, wherein
the upstream-side path is located so as to overlap a part of the capacitor busbar that is thermally connected to the first surface, as seen in the normal direction.

6. The power conversion device according to claim 1, wherein
the capacitor body portion has a capacitor case formed in a bottomed tubular shape and storing, with sealing resin interposed, the capacitor element and a part of the capacitor busbar that is connected to the capacitor element, an outer surface of a bottom wall of the capacitor case is thermally connected to the second surface, the capacitor busbar has an exposed portion protruding from the sealing resin, at an opening part of the capacitor case on a side opposite to the bottom wall, and the exposed portion extends toward an outer side of a peripheral wall of the capacitor case, then extends along an outer surface of the peripheral wall of the capacitor case toward the second surface, and further extends along the first surface toward the module body portion.

7. The power conversion device according to claim 1, wherein
said capacitor busbar comprises a first capacitor busbar connected to a first electrode of the capacitor element and a second capacitor busbar connected to a second electrode of the capacitor element are provided, and both of the first capacitor busbar and the second capacitor busbar are thermally connected to the first surface.

8. The power conversion device according to claim 1, wherein
a direction opposite to a normal direction of the first surface is defined as a normal opposite direction, a specific direction parallel to the first surface is defined as a first direction, and a direction parallel to the first surface and perpendicular to the first direction is defined as a second direction, as the capacitor busbar, a first capacitor busbar connected to a first electrode of the capacitor element and a second capacitor busbar connected to a second electrode of the capacitor element are provided, the first capacitor busbar has a first opposed portion opposed to the second capacitor busbar in the normal direction or the normal opposite direction, and a first non-opposed portion which extends from the first opposed portion toward the module body portion side and is not opposed to the second capacitor busbar in the normal direction and the normal opposite direction, the second capacitor busbar has a second opposed portion opposed to the first capacitor busbar in the normal direction or the normal opposite direction, and a second non-opposed portion which extends from the second opposed portion toward the module body portion side and is not opposed to the first capacitor busbar in the normal direction and the normal opposite direction, the first opposed portion and the second opposed portion are thermally connected to each other via an insulating member, and one of the first opposed portion and the second opposed portion that is closer to the first surface is thermally connected to the first surface, and one or both of the first non-opposed portion and the second non-opposed portion are thermally connected to the first surface.

9. The power conversion device according to claim 8, wherein
the capacitor body portion includes a plurality of the capacitor elements arranged in the second direction, the first opposed portion extends in the second direction so as to connect the first electrodes of the plurality of capacitor elements to each other, and the second opposed portion extends in the second direction so as to connect the second electrodes of the plurality of capacitor elements to each other.

10. The power conversion device according to claim 8, wherein
an N number of the module body portions are provided so as to be arranged in the second direction, N being an integer not less than 2, an N number of the first non-opposed portions and an N number of the second non-opposed portions are provided so as to be arranged in the second direction and extend toward another side in the first direction, and two said power terminals of each of the N number of module body portions are connected to a corresponding one of the first non-opposed portions and a corresponding one of the second non-opposed portions.

11. The power conversion device according to claim 1, wherein
a direction opposite to a normal direction of the first surface is defined as a normal opposite direction, a specific direction parallel to the first surface is defined as a first direction, and a direction parallel to the first surface and perpendicular to the first direction is defined as a second direction, a plurality of the module body portions are provided so as to be arranged in the second direction, the capacitor module is located on one side in the first direction of the plurality of module body portions so as to overlap the plurality of module body portions, as seen in the first direction, and the capacitor busbar extends toward another side in the first direction from the capacitor body portion toward the plurality of module body portions, as seen in the normal direction.

12. The power conversion device according to claim 1, wherein a direction opposite to a normal direction of the first surface is defined as a normal opposite direction, the power conversion device further comprises a control board for controlling the power module, a position in the normal direction of an end on the normal-direction side of the capacitor body portion and a position in the normal direction of an end on the normal-direction side of the module body portion are equivalent to each other, the control board is provided on the normal-direction side relative to the capacitor module and the power module, and the control board overlaps both of the capacitor module and the power module, as seen in the normal direction.

13. The power conversion device according to claim 12, wherein the capacitor busbar has a board connection terminal extending in the normal direction from a part thermally connected to the first surface, the board connection terminal being electrically and thermally connected to the control board.

14. The power conversion device according to claim 6, wherein a direction opposite to a normal direction of the first surface is defined as a normal opposite direction, the power conversion device further comprises an additional heat transfer member, and the additional heat transfer member is provided on the normal-direction side relative to the capacitor body portion and is thermally connected to the exposed portion of the capacitor busbar.

15. The power conversion device according to claim 14, wherein the additional heat transfer member has a part extending toward the power module side and thermally connected to the power module.

16. The power conversion device according to claim 14, wherein the additional heat transfer member is thermally connected to the housing.

17. The power conversion device according to claim 12, wherein the power conversion device further comprises an additional heat transfer member, the additional heat transfer member is provided between the control board, and the capacitor body portion and the module body portion, and is thermally connected to the capacitor module and the power module, and the additional heat transfer member has a board support portion supporting the control board, on the normal-direction side.

18. The power conversion device according to claim 2, wherein the layer of the heat transfer member is a grease, a resin sheet, or a resin member surrounding a part of the capacitor busbar that is thermally connected to the first surface.

19. The power conversion device according to claim 14, wherein the additional heat transfer member is metal, a resin sheet, or a resin member surrounding the exposed portion part of the capacitor busbar.

20. The power conversion device according to claim 1, wherein the capacitor busbar is, at the location, in direct contact with the layer of the heat transfer member, and wherein the capacitor busbar is, at the location, closer to the first surface than is the power terminal to the first surface.

21. The power conversion device according to claim 1, wherein the capacitor busbar is connected to the power terminal at a terminal end of the capacitor busbar, wherein the terminal end of the capacitor busbar is outside of the capacitor module, and wherein the location outside of the capacitor module is, along a length of the capacitor busbar from an opening of the capacitor module to the power terminal, between the opening and the power terminal.

* * * * *